US007123679B2

(12) United States Patent
Joo

(10) Patent No.: US 7,123,679 B2
(45) Date of Patent: Oct. 17, 2006

(54) COUNTER HAVING IMPROVED COUNTING SPEED

(75) Inventor: Ki-mo Joo, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 123 days.

(21) Appl. No.: 10/269,253

(22) Filed: Oct. 11, 2002
(Under 37 CFR 1.47)

(65) Prior Publication Data
US 2004/0008808 A1    Jan. 15, 2004

(30) Foreign Application Priority Data
Oct. 16, 2001    (KR)    ............................... 2001-63769

(51) Int. Cl.
*H03K 23/40*    (2006.01)
(52) U.S. Cl. ...................... 377/106; 377/107
(58) Field of Classification Search .................. 377/47, 377/104, 106, 107
See application file for complete search history.

(56) References Cited

U.S. PATENT DOCUMENTS

| | | | | |
|---|---|---|---|---|
| 4,521,898 | A | * | 6/1985 | Akram ........................ 377/116 |
| 4,845,727 | A | * | 7/1989 | Murray ........................ 377/43 |
| 5,432,830 | A | * | 7/1995 | Bonnot ........................ 417/41 |
| 5,748,949 | A | * | 5/1998 | Johnston ...................... 713/502 |
| 6,282,255 | B1 | * | 8/2001 | La Rosa et al. .............. 377/47 |

FOREIGN PATENT DOCUMENTS

KR    99-080027    5/1999

* cited by examiner

*Primary Examiner*—Timothy P. Callahan
*Assistant Examiner*—Cassandra Cox
(74) *Attorney, Agent, or Firm*—Mills & Onello LLP

(57) ABSTRACT

A counter having enhanced counting speed is provided. The counter includes first through N-th output signal generators. The first output signal generator responds to a clock signal and outputs a first output signal in which a low level and a high level are output once per cycle of the clock signal. The second output signal generator responds to the clock signal and the first output signal and outputs a second output signal in which a low level and a high level are output every two cycles of the clock signal. The third output signal generator responds to the clock signal and the second output signal and outputs a third output signal in which a low level and a high level are output every four cycles of the clock signal. The N-th output signal generator responds to the clock signal and the N−1th output signal and outputs an N-th output signal in which a low level and a high level are output every $2^{N-1}$ (where N is a natural number greater than 1) cycles of the clock signal. The first through N-th output signals represent logic values of an N-bit counter in which the first output signal is the least significant bit and the N-th output signal is the most significant bit. A synchronous or non-synchronous counter according to the present invention has reduced delay time, thereby ensuring a spacious operation margin in the design of peripheral circuits of the counter.

4 Claims, 7 Drawing Sheets

COUNTER HAVING IMPROVED COUNTING SPEED

BACKGROUND OF THE INVENTION

1. Field of the Invention

The present invention relates to a counter, and more particularly, to a counter having improved counting speed.

2. Description of the Related Art

As system-on-chip (SOC) systems have become faster, the core of each chip has been specially developed. In general, counters are used in most semiconductor devices and play an important role in determining delay between pipes. A short counter delay helps reduce the burden of combinational logic due to delay time, ensuring an operational margin in the design of the semiconductor circuit.

FIG. 1 is a block diagram of a circuit of a general synchronous counter. Referring to FIG. 1, a synchronous counter 100 is set or reset in response to a reset signal RN and includes first through fourth flip flops 110, 120, 130, 140 and first and second combinational logic blocks 150 and 160 which operate in response to a clock signal CK. The first flip flop 110 receives an inversion signal BOUT1 of a first output signal OUT1 through an input terminal D, and the second flip flop 120 receives an output signal OUT1 of the first flip flop 110 through an input terminal D. The third flip flop 130 receives a second output signal OUT2 through an input terminal D via the first combinational logic block 150. The fourth flip fop 140 receives the third output signal OUT3 through an input terminal D via the second combinational logic block 160. Signals OUT1 through OUT4 indicate the least significant bit (LSB) through most significant bit (MSB) of the counter 100. Here, the counter 100 is a four-bit counter.

Such a synchronous counter includes the combinational logic blocks 150 and 160, as well as the flip flops 110 through 140, which cause a predetermined delay logic blocks when determining the next state of the counter 100. Further, it is difficult to determine the maximum frequency of the counter 100 because of these combinational logic blocks 150 and 160. That is, the combinational logic blocks 150 and 160, such as adders used in determining the LSB of the counter 100, are required in order to determine the MSB of the next state of the counter 100. For this reason, an increase in the number of bits of the counter 100 results in an increase in delay time.

FIG. 2 is a timing diagram of the operation of the synchronous counter 100 of FIG. 1. In the synchronous counter 100, the output signals OUT1 through OUT4 are all output almost at the same time, but not until after a delay of about 1.5 ns from receiving a clock signal CK.

FIG. 3 is a block diagram of a circuit of a general four-bit non-synchronous counter. Referring to FIG. 3, a non-synchronous counter 300 is set or reset in response to a reset signal RN, and includes a flip flop 310 which operates in response to a clock signal CK, and flip flops 320, 330 and 340 which operate in response to output signals OUT1 through OUT3 output from the flip flops 310, 320 and 330. The flip fops 310, 320, 330 and 340 receive inversion signals BOUT1 through BOUT4 of the output signals OUT1 through OUT4 through an input terminal D. The output signals OUT1 through OUT4 indicate the LSB through MSB of the counter 300.

In such a non-synchronous counter, the output signal of one flip flop is determined by the output signal of the previous flip flop, and thus the generated output signal is delayed for a predetermined time.

FIG. 4 is a timing diagram of the non-synchronous counter 300 of FIG. 3. Referring to FIG. 4, the final state of the counter 300 is at a point when the MSB of the counter is determined and a fourth output signal OUT4 is output. Output signals OUT1 through OUT4 are sequentially generated, and in particular the fourth output signal OUT4 is not output until a delay of about 1 ns after a clock signal CK is input. Also, the fourth output signal OUT4 is generated after one period of the clock signal CK, which is a malfunction of the counter 300.

As described above, both a synchronous counter and a non-synchronous counter have a predetermined delay, which must be reduced.

SUMMARY OF THE INVENTION

To solve the above problem, it is an objective of a present invention to provide a counter that performs counting at a high speed.

In accordance with one aspect of the invention, there is provided a counter including: a first output signal generator for outputting a first output signal in which a low level and a high level are output once per cycle of a clock signal, in response to the clock signal; a second output signal generator for outputting a second output signal in which a low level and a high level are output every two cycles of the clock signal, in response to the clock signal and the first output signal; a third output signal generator for outputting a third output signal in which a low level and a high level are output every four cycles of the clock signal, in response to the clock signal and the second clock signal; and an N-th output signal generator for outputting an N-th output signal in which a low level and a high level are output every $2^{N-1}$ cycles of the clock signal, in response to the clock signal and an N–1th output signal, where N is a natural number greater than 1, wherein the first through N-th output signals represent logic values of an N-bit counter having the first output signal as the least significant bit (LSB) and the N-th output signal as the most significant bit (MSB).

In accordance with another aspect of the invention, there is provided a counter including: a first output signal generator for outputting a first output signal in which a low level and a high level are output once per cycle of a clock signal, in response to the clock signal; an N-th output signal generator for outputting an N-th output signal in which a low level and a high level are output every $2^{N-1}$ cycles of the clock signal, in response to the clock signal and an N–1th output signal, where N is a natural number greater than 1; an N+1th output signal generator for outputting an N+1th output signal in which a low level and a high level are output once per cycle of the N-th output signal, in response to the N-th output signal; and an N+M-th output signal generator for outputting an N+M-th output signal in which a low level and a high level are output every $2^{M-1}$ cycles of the clock signal, in response to the N-th output signal and an N+M–1th output signal, where M is a natural number greater than 1, wherein the first through N+M-th output signals represent logic values of an N+M-bit counter having the first output signal as the least significant bit (LSB) and the N+M-th output signal as the most significant bit (MSB).

Preferably, the counter includes: an N+M+1th output signal generator for outputting an N+M+1th output signal in which a low level and a high level are output once per cycle of the N+M-th output signal, in response to the N+M-th output signal; and a plurality of state generators including an N+M+K-th output signal generator for outputting an N+M+K-th output signal in which a low level and a high level are output every $2^{K-1}$ cycles of the N+M-th output signal, in response to the N+M-th and N+M+K−1th output signals, where K is a natural number greater than 1, wherein each state generator receives the final output signal generated by the preceding state generator as a clock.

In accordance with another aspect of the invention, there is provided a counter including: a first output signal generator for responding to a clock signal, receiving an inversion signal of a predetermined first output signal, and outputting the inversion signal as the first output signal; and second through N-th output signal generators for outputting predetermined second through N-th output signals in response to the clock signal and the output of the preceding output signal generator, where N is a natural number greater than 2, wherein the first through N-th output signals represent logic values of an N-bit counter having the first output signal as the LSB and the N-th output signal as the MSB.

Preferably, the first output signal generator includes a first flip flop that responds to the clock signal, receives an inversion signal of the first output signal and outputs the inversion signal as the first output signal. Also, preferably, the second through N-th output signal generators includes $2^{N-2}$ flip flops connected in series; and selecting means for responding to an output signal generated by the preceding output signal generator, selecting either the output signal of the last flip flop or an inversion signal of the output signal, and outputting the selected signal to the first flip flop, and the flip flops which are connected in series operate in response to the clock signal and generate the output of the last flip flop as the respective one of the second through Nth output signals.

In accordance with another aspect of the invention, there is provided a counter including: a first output signal generator for responding to a clock signal, receiving an inversion signal of a predetermined first output signal, and outputting the inversion signal as the first output signal; an N-th output signal generator for responding to the clock signal and the N−1th output signal and outputting a predetermined N-th output signal, where N is a natural number greater than 2; an N+1th output signal generator for responding to the N-th output signal, receiving an inversion signal of a predetermined N+1th output signal, and outputting the inversion signal of the N+1th output signal; and an N+M-th output signal generator for responding to the N-th output signal and the N+M−1th output signal and outputting a predetermined N+M-th output signal, wherein the first through N+M-th output signals represent logic values of an N+M-bit counter in which the first output signal is the LSB and the N+M-th output signal is the MSB.

Preferably, the counter further includes: an N+M+1th output signal generator for responding to the N+M-th output signal and receiving an inversion signal of a predetermined N+M+1th output signal, and outputting the result as the N+M+1-th output signal; and a plurality of state generators including an N+M+K-th output signal generator which responds to the N+M-th output signal and the N+M+K−1th output signal and outputs a predetermined N+M+K-th output signal, where K is a natural number greater than 2, wherein each state generator receives the final output signal of the preceding state generator as a clock.

As described above, in synchronous and non-synchronous counters according to the present invention, it is possible to reduce delay time occurring during counting, thereby ensuring a wide operational margin in the design of peripheral circuits of counters.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 5:
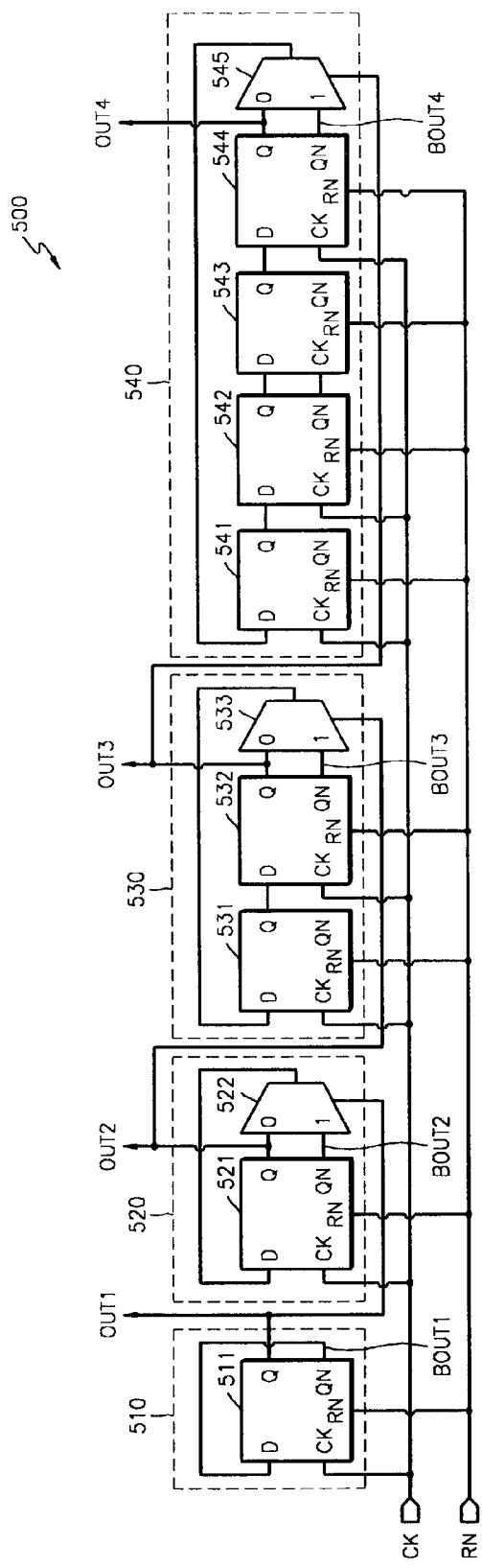
FIG. 5 is a block diagram of a circuit of a synchronous counter according to first and third embodiments of the present invention.

FIG. 5 is a block diagram of a circuit of a synchronous counter 500 according to a first embodiment of the present invention. Referring to FIG. 5, the synchronous counter 500 includes first through N-th output signal generators 510, 520, 530, 530 and 540. 'N' is a natural number greater than 1, set to 4 for this description.

The first output signal generator 510 outputs a first output signal OUT1, which has a low level and a high level in each cycle of a clock signal CK, in response to the clock signal CK. The second output signal generator 520 outputs a second output signal OUT2, which has a low level and a high level in every two cycles of the clock signal CK, in response the clock signal CK and the first output signal OUT1. The third clock signal generator 530 outputs a third output signal OUT3, which has a low level and a high level in every four cycles of the clock signal CK, in response to the clock signal CK and the second output signal OUT2. The N-th output signal generator outputs an N-th output signal, which has a low level and a high level in every $2^{N-1}$ cycles of the clock signal CK, in response to the clock signal CK and N−1th output signal, where 'N' is a natural number greater than 1. That is, in this case the fourth output signal generator 540 outputs a fourth output signal OUT4, which has a low level and a high level every eight cycles of the clock signal CK, in response to the clock signal CK and the third output signal OUT3.

The first through fourth output signals OUT1 through OUT4 represent logic values of a four-bit counter having the first output signal OUT1 as the LSB (least significant bit) and the fourth output signal OUT4 as the MSB (most significant bit).

Hereinafter, the operation of a circuit of a synchronous counter 500 according to the first embodiment of the present invention will be described with reference to FIG. 5.

In general, in the counting of a counter, 0 and 1 are output once per clock cycle in the LSB, and 00 and 11 are output once per clock cycle in a second bit. In the next bit, 0000 and 1111 are output once per clock cycle. In a counter according to the present invention, counting is performed according to a predetermined pattern. The counter according to the first embodiment of the present invention is related to an N-bit synchronous counter, where 'N' is a natural number greater than 1, but will now be described as a four-bit counter (where 'N' is four) as an example.

The first output signal generator 510 outputs the first output signal OUT1, which has a low level and a high level once per clock cycle, in response to the clock signal CK. Here, the first output signal generator 510 includes a first flip flop 511 that responds to the clock signal CK, receives an inversion signal BOUT1 of the first output signal OUT1 through an input terminal D, and finally outputs the first output signal OUT1. At this time, 0 and 1 are output in the first output signal OUT1, and thus the first flip flop 511 becomes a toggle flip flop.

The second output signal generator 520 outputs the second output signal OUT2, which has a low level and a high level every two cycles of the clock signal CK, in response to the clock signal CK and the first output signal OUT1. Here, the second output signal generator 520 includes a D flip flop 521 and a selecting means 522. The selecting means 522 selects either a second output signal OUT2 of the flip flop 521 or an inversion signal BOUT2 of the second output signal, in response to the first output signal OUT1 generated by the first output signal generator 510, and outputs the selected signal to the input terminal D of the flip flop 521. The selecting means 522 outputs the inversion signal BOUT2 of the second output signal OUT2 when the first output signal OUT1 is '1' and outputs the second output signal OUT2 when the first output signal OUT1 is '0'. Here, the selecting means 522 may be a multiplexer. If the logic value of the first output signal OUT1 is '1', the second output signal OUT2 is inverted at the next cycle of the clock signal CK. The output of the selecting means 522 is transmitted to the input terminal D of the flip flop 521. As a result, the second output signal generator 520 outputs '00' and '11' repeatedly. Thus, in the first and second output signals OUT1 and OUT2, 00, 01, 10 and 11 are output once per cycle of the clock signal CK.

The third output signal generator 530 outputs the third output signal OUT3, which has a low level and a high level once every four cycles of the clock signal CK, in response to the clock signal CK and the second output signal OUT2. To output the third output signal OUT3, the third output signal generator 530 includes two D flip flops 531 and 532 and a selecting means 533, connected in series. The selecting means 533 selects either a third output signal OUT3 of the flip flop 532 or an inversion signal BOUT3 of the third output signal OUT3, and outputs the selected signal to the input terminal D of the flip flop 531. The selecting means 533 outputs the inversion signal BOUT3 of the third output signal when the second output signal OUT2 is 1, and outputs the third output signal OUT3 when the second output signal OUT2 is 0. The output of the selecting means 533 is transmitted to the input terminal D of the flip flop 531, which is located at the head of the third output signal generator 530, out of the flip flops 531 and 532 which are connected in series. The third output signal generator 530 has two flip flops 531 and 532 and thus the same logic value is output four times in the third output signal OUT3 when the second output signal OUT2 is 0 two times, which controls the selecting means 533, whereas the logic value of the third output signal OUT3 is inverted and output four times when the second output signal OUT2 is 1 two times. As a result, the third output signal generator 530 repeatedly outputs 0000 and 1111 as the third output signal OUT3. Therefore, 000, 001, 010, 011, 100, 101, 110 and 111 are repeatedly output as the first through third output signals OUT1 through OUT3 per cycle of the clock signal CK.

The fourth output signal generator 540 outputs a fourth output signal OUT2, which has a low level and a high level once per every eight cycles of the clock signal CK, in response to the clock signal CK and the third output signal OUT3. To output the fourth output signal OUT4, the fourth output signal generator 540 includes four D flip flops 541 through 544 and a selecting means 545. The selecting means 545 selects either the fourth output signal OUT4 of the flip flop 544 or the inversion signal BOUT4 of the fourth output signal in response to the third output signal OUT3 generated by the third output signal generator 530, and outputs the selected signal to an input terminal D of the flip flop 541. The selecting means 545 outputs the inversion signal BOUT4 of the fourth output signal when the third output signal OUT3 is 1, and outputs the fourth output signal OUT4 when the third output signal OUT3 is 0. The output of the selecting means 545 is transmitted to the input terminal D of the first flip flop 541, which is located at the head of the fourth output signal generator 540, out of the flip flops 541 through 544 which are connected in series. The fourth output signal generator 540 includes four flip flops 541 through 544, and thus the same logic value is output eight times in the fourth output signal OUT4 when the third output signal OUT3, which controls the selecting means 545, is output as 0 four times, whereas the logic value of the fourth output signal OUT4 is inverted and output eight times when the third output signal OUT3 is output as 1 four times. As a result, the fourth output signal generator 540 repeatedly outputs 00000000 and 11111111 as the fourth output signal OUT4. Therefore, in the first through fourth signals OUT1 through OUT4, 0000, 0001, 0010, 0011, 0100, 0101, 0110, 0111, 1000, 1001, 1010, 1011, 1100, 1101, 1110 and 1111 are output once per cycle of the clock signal CK. At this time, the first through fourth output signals OUT1 through OUT4 are the same as the logic values generated by a four-bit synchronous counter.

Similarly, the N-th output signal generator outputs an N-th output signal, which has a low level and a high level every $2^{N-1}$ output signals, in response to the clock signal CK and N−1th output signal, where 'N' is a natural number greater than 1.

The first through N-th output signal generators include $2^{N-2}$ flip flops, and have a structure in which flip flops are connected in series and the output of the selecting means is transmitted to the flip flop at the head of the same output signal generator. The selecting means is controlled by the output signal of the preceding output signal generator. Then, the first through N-th output signals indicate logic values of an N-bit counter having the first output signal as the LSB and the N-th output signal as the MSB. Also, all the flip flops presented in the first through N-th output signal generators are set or reset in response to a set or reset signal RN.

The delay time of the above-described synchronous counter is the same as the delay of one selecting means, and thus this counter counts faster than conventional counters.

Figure 1:
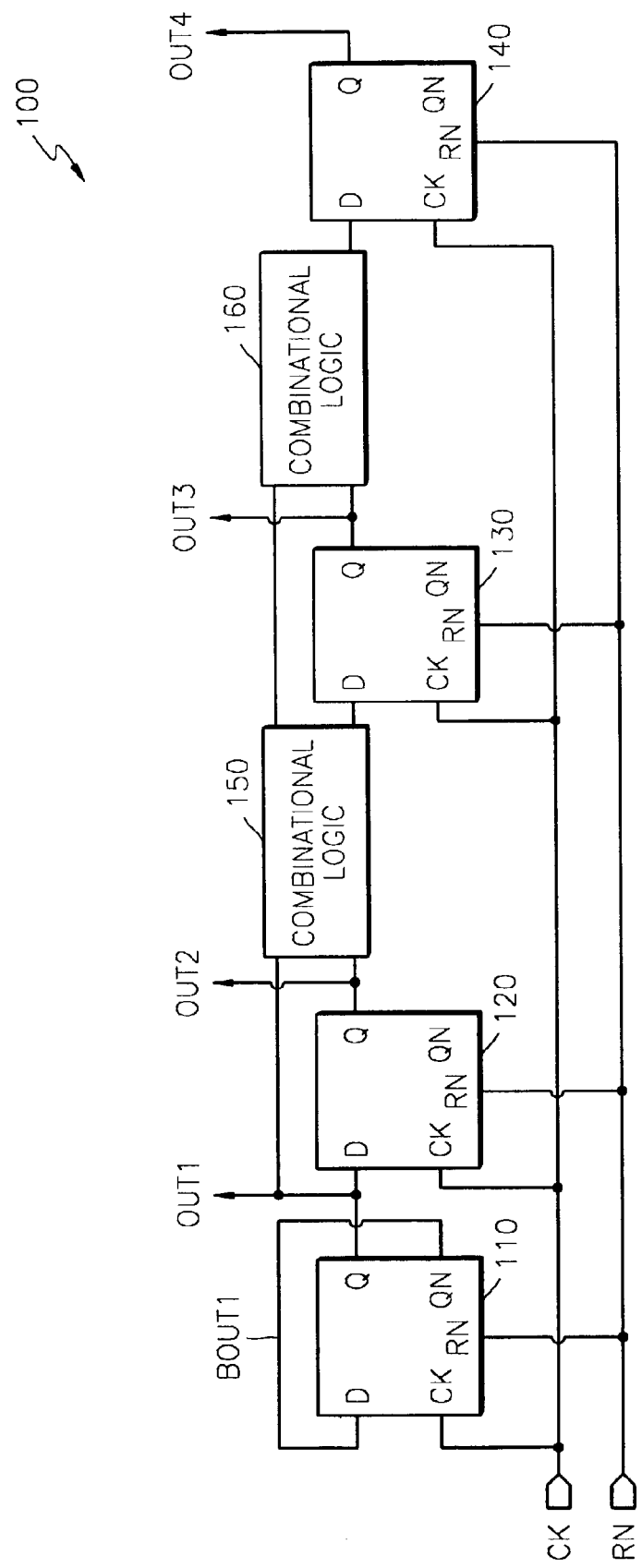
FIG. 1 is a block diagram of a circuit of a general synchronous counter.
Figure 2:
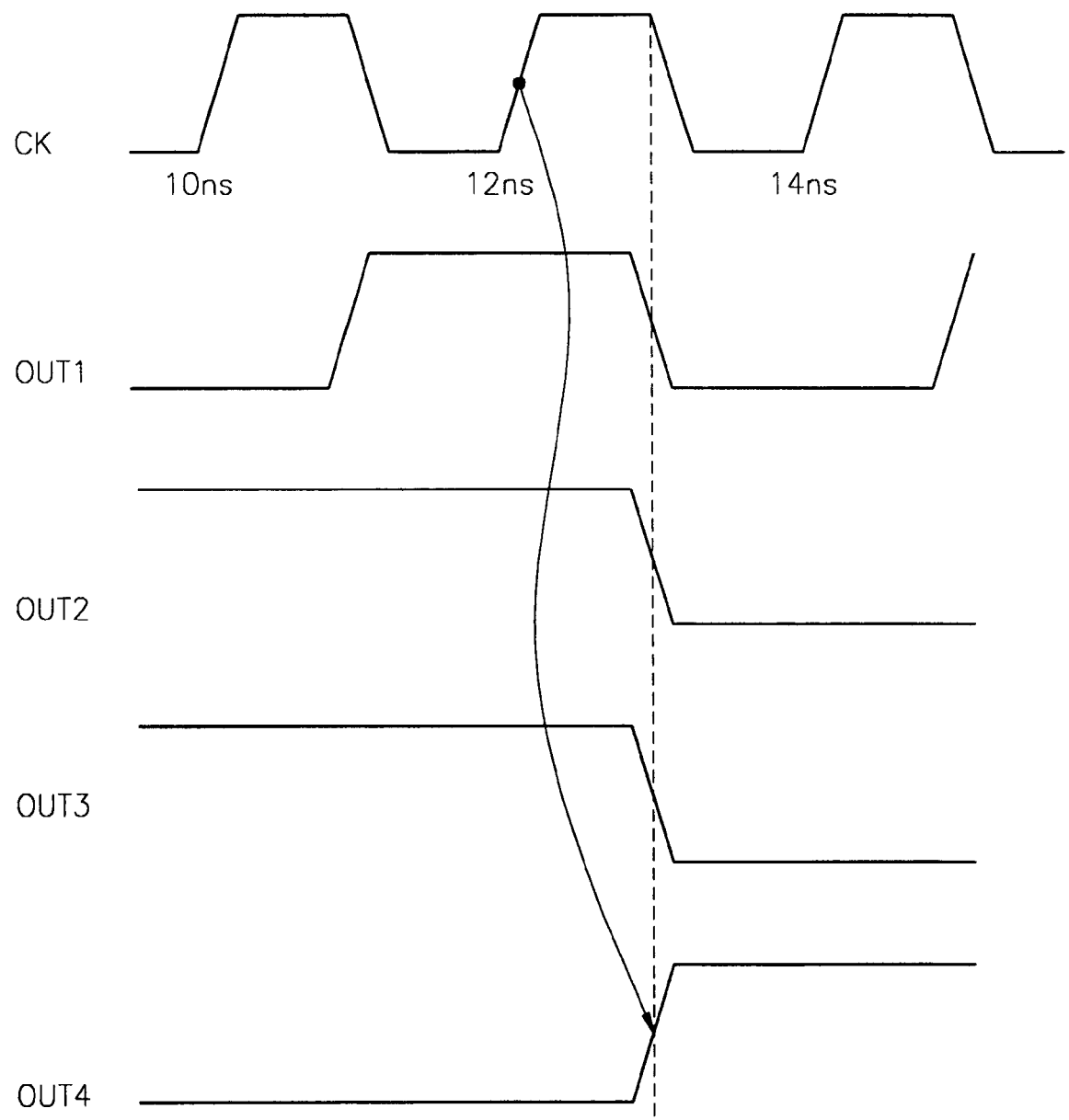
FIG. 2 is a timing diagram of the operation of the synchronous counter of FIG. 1.
Figure 3:
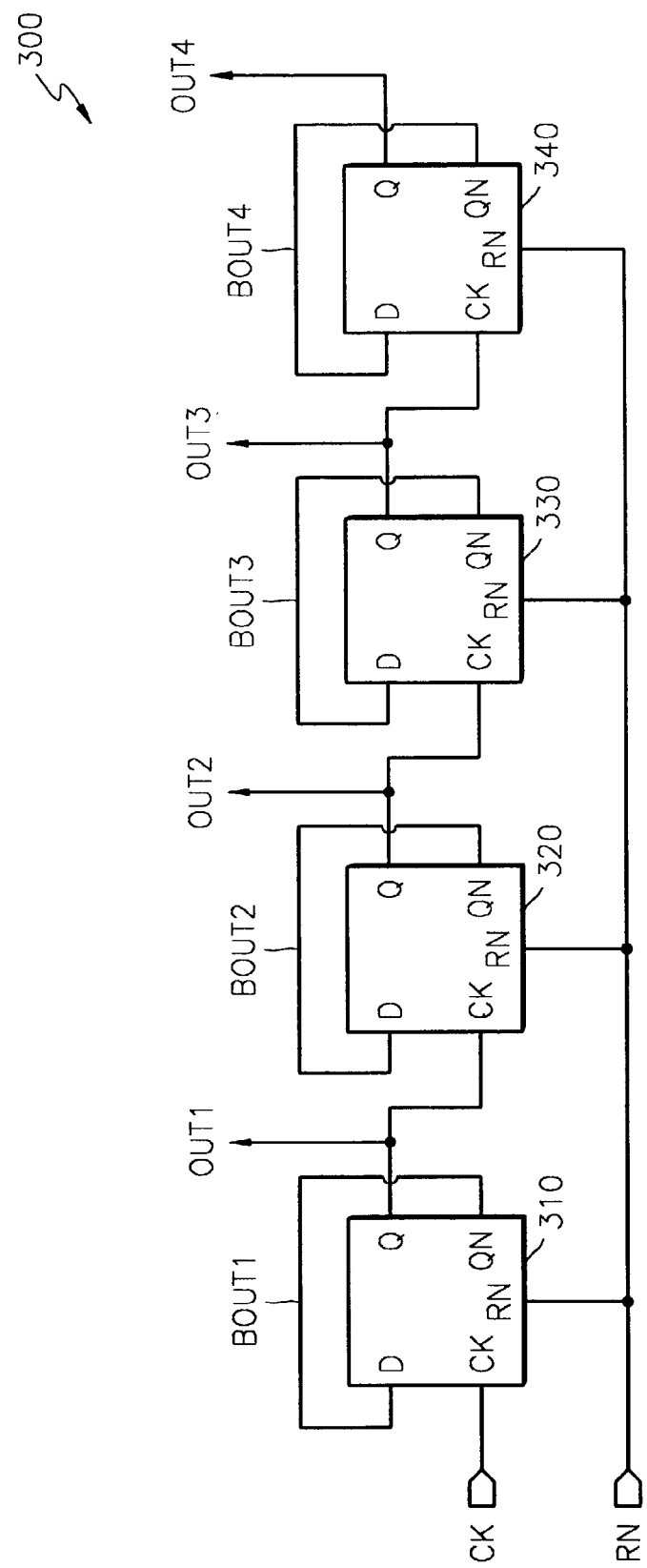
FIG. 3 is a block diagram of a circuit of a general non-synchronous counter.
Figure 4:
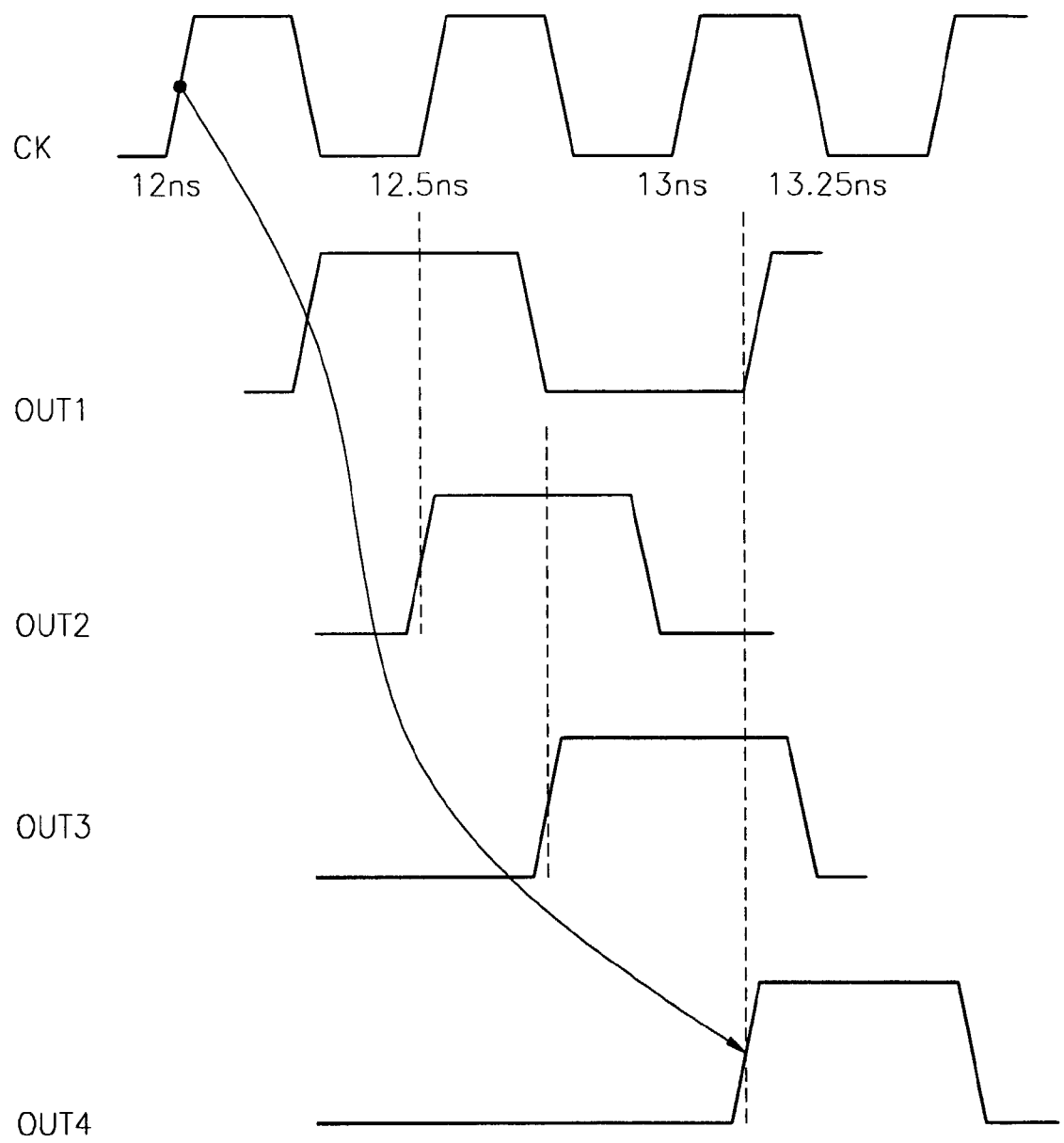
FIG. 4 is a timing diagram of the non-synchronous counter of FIG. 3.
Figure 6:
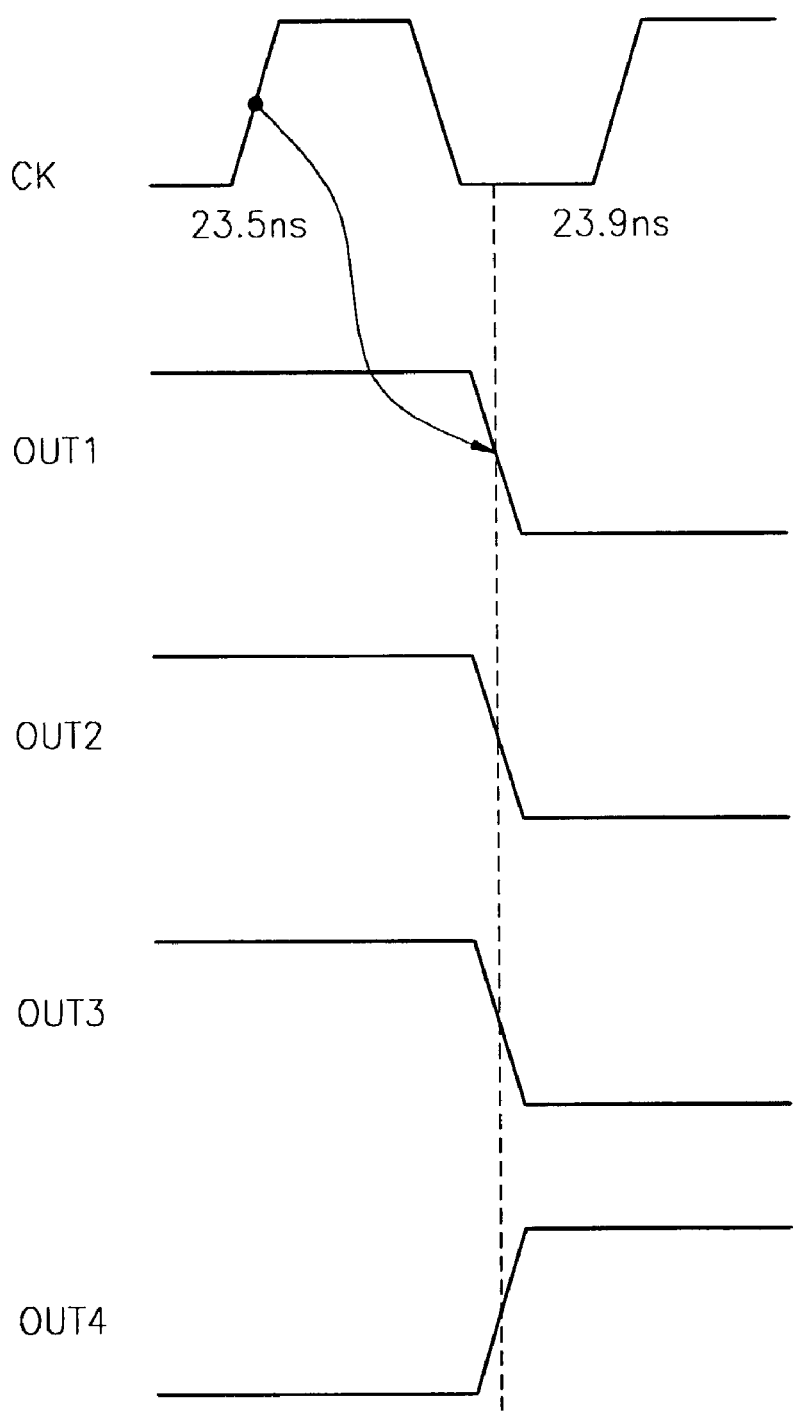
FIG. 6 is a timing diagram of the operation of the synchronous counter of FIG. 5.

FIG. 6 is a timing diagram of the synchronous counter 500 of FIG. 5. In the counter 500, the output signals OUT1 through OUT4 are all output at almost the same time. Each of the output signals OUT1 through OUT4 is delayed for about 0.5 ns after the input of a clock signal CK. From FIG. 6, it is noted that the delay time of the counter 500 is much less than that of the conventional counter 100 of FIG. 2, under the same conditions.

Figure 7:
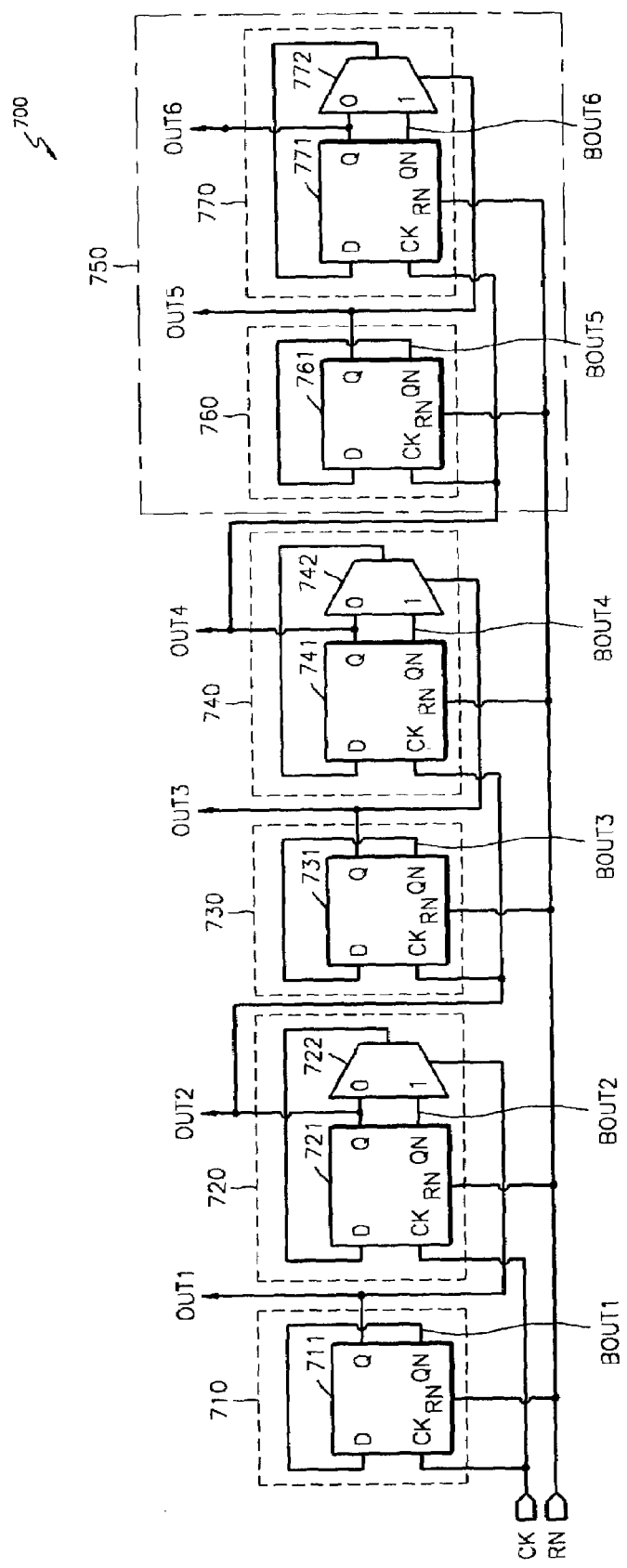
FIG. 7 is a block diagram of a circuit of a non-synchronous counter according to second and fourth embodiment of the present invention.

FIG. 7 is a block diagram of a circuit constituting a non-synchronous counter 700 according to a second embodiment of the present invention. The counter 700 includes first through N-th output signal generators and N+1$^{th}$ through N+M-th output signal generators. N and M are natural numbers greater than 1, and for this description N is set to 2 and M is set to 2.

A first output signal generator 710 responds to a clock signal CK and outputs a first output signal OUT1 that has a low level and a high level once per cycle of the clock signal CK.

A second output signal generator 720 responds to the clock signal CK and the first output signal OUT1 and outputs a second output signal OUT2 which has a low level and a high level every two cycles of the clock signal CK.

A third output signal generator 730 responds to the second output signal OUT2 and outputs a third output signal OUT3 which has a low level and a high level once per cycle of the second output signal OUT2.

A fourth output signal generator 740 responds to the second and third output signals OUT2 and OUT3 and outputs a fourth output signal OUT4 which has a low level and a high level every two cycles of the second output signal OUT2.

In the third output signal OUT3, a low level and a high level are output once per cycle of the second output signal OUT2, which is the same as when a low level and a high level are output every four cycles of the clock signal CK. Also, in the fourth output signal OUT4, a low level and a high level are output every two cycles of the second output signal OUT2, which is the same as when a low level and a high level are output every eight cycles of the clock signal CK.

Therefore, the first through fourth output signals OUT1 through OUT4 represent logic values of a four-bit non-synchronous counter having the first output signal OUT1 as the LSB and the fourth output signal OUT4 as the MSB.

In the operation of the non-synchronous counter 700 according to the second embodiment, with reference to FIG. 7, the first and second output signal generators 710 and 720 have the same structure as the first and second output signal generators 510 and 520 shown in FIG. 5. That is, the first output signal generator 710 includes a first flip flop 711 that responds to the clock signal CK, receives an inversion signal BOUT1 of the first output signal OUT1 through an input terminal D, and outputs the same as the first output signal OUT1. The second output signal generator 720 includes a D flip flop 721 and a selecting means 722. The selecting means 722 responds to the first output signal OUT1 generated by the first output signal generator 710, selects either a second output signal OUT2 of the flip flop 721 or an inversion signal BOUT2 of the second output signal OUT2, and outputs the selected signal to the input terminal D of the flip flop 721. The selecting means 722 outputs the inversion signal BOUT2 of the second output signal when the first output signal OUT1 is 1, and outputs the second output signal OUT2 when the first output signal OUT1 is 0. Here, the selecting means 722 may be a multiplexer. If the logic value of the first output signal OUT1 is 1, the second output signal OUT2 is inverted in the next cycle of the clock signal CK. The output of the selecting means 722 is transmitted to the input terminal D of the flip flop 721. As a result, 00 and 11 are repeatedly output by the second output signal generator 720. In the first and second output signals OUT1 and OUT2, 00, 01, 10 and 11 are output per cycle of the clock signal CK. Similarly, the number of output signal generators, each having a circuit construction equal to those shown in the synchronous counter 500 of FIG. 5 and operating in response to the clock signal CK, may be increased to N, where N is a natural number greater than 1.

Thus, the N-th output signal generator responds to the clock signal CK and an N−1th output signal, and outputs an N-th output signal having a low level and a high level every $2^{N-1}$ cycles of the clock signal CK, where N is a natural number greater than 1.

The third and fourth output signal generators 730 and 740 have the same circuit construction as the first and second output signal generators 710 and 720, but have a difference in that flip flops 731 and 741 operate in responce to the second output signal OUT2 rather than the clock signal CK. Here, the number of third and fourth output signal generators OUT3 and OUT4, which operate in response to the second output signal OUT2, can be increased to M. As a result, an N+M-th output signal generator responds to the second output signal OUT2 and an N+M−1th output signal, and outputs an N+M-th output signal having a low level and high level every $2^{M-1}$ cycles of the second output signal OUT2.

The third output signal generator 730 receives the second output signal OUT2 as a clock and outputs a third output signal OUT3 having a low level and a high level once per cycle of the second output signal OUT2, which is the same as when a low level and a high level are repeated output every four cycles of the clock signal CK. That is, 0000 and 1111 are output in the third output signal OUT3. In the meantime, the fourth output signal generator 740 receives the second output signal OUT2 as a clock and outputs a fourth output signal OUT4 having a low level and a high level once every two cycles of the second output signal OUT2, which is the same as when a high level and a low level are output every eight cycles of the clock signal CK. That is, 00000000 and 11111111 are output in the fourth output signal OUT4.

Accordingly, the non-synchronous counter 700 is a four-bit non-synchronous counter in which the first output signal OUT1 and the fourth output signal OUT4 are output as the LSB and the MSB, respectively. The non-synchronous counter 700 of FIG. 7 becomes an N+M-bit non-synchronous counter when the number of output signal generators which operate in response to the clock signal CK is N and the number of output signal generators which operate in response to a N-th output signal is M.

The delay time of such a four-bit non-synchronous counter 700 is the same as the combination of the delay times in the two selecting means 722 and 742, and thus the counter 700 counts faster than conventional non-synchronous counters.

It is preferable that the non-synchronous counter 700 of FIG. 7 further include a plurality of state generators 750. The state generator 750 includes: an N+M+1th output signal generator which responds to the N+M-th output signal and outputs an N+M+1th output signal which has a low level and a high level once per cycle of the N+M-th output signal and an N+M+K-th output signal generator which responds to the N+M-th output signal and an N+M+K−1th output signal and outputs an N+M+K-th output signal which has a low level and a high level every $2^{K-1}$ cycles of the N+M-th output signal, where K is a natural number greater than 1. Each state generator 750 operates according to the final output signal generated by the preceding state generator 750.

For example, assuming that N, M and K are all 2, the state generator 750 includes a fifth output signal generator 760 which responds to the fourth output signal OUT4 and outputs a fifth output signal OUT5 which has a low level and a high level once per cycle of the fourth output signal OUT4, and a sixth output signal generator 770 which responds to the fourth and fifth output signals OUT4 and OUT5 and outputs a sixth output signal OUT6 which has a low level and a high level every two cycles of the fourth output signal OUT4.

The fifth and sixth output signal generators 760 and 770, which are included in the state generator 750, have equivalent circuits to the first and second output signal generators 710 and 720. However, the circuits of the fifth and sixth output signal generators 760 and 770 differ in that flip flops 761 and 771 operate in response to the fourth output signal OUT4 rather than the clock signal CK. The number of output signal generators which operate in response to the fourth output signal OUT4 can be increased to K.

The fifth output signal generator 760 receives the fourth output signal OUT4 as a clock and outputs a fifth output signal OUT5 which has a low level and a high level once per cycle of the fourth output signal OUT4. This means that a high level and a low level are output every sixteen cycles of the clock signal CK in the fifth output signal OUT5. That is, 0000, 0000, 0000, 0000, 1111, 1111, 1111, 1111 is output in the fifth output signal OUT5. In the meantime, the sixth output signal generator 770 receives the fourth output signal OUT4 as a clock and outputs a sixth output signal OUT6 which has a low level and a high level every two cycles of the fourth output signal OUT4. This means that a high level and a low level are output every thirty two cycles of the clock signal CK in the sixth output signal OUT6. In other words, 0000, 0000, 0000, 0000, 0000, 0000, 0000, 0000, 0000, 1111, 1111, 1111, 1111, 1111, 1111, 1111, 1111 are output in the sixth output signal OUT6.

In this case, the non-synchronous counter 700 of FIG. 7 is a six-bit non-synchronous counter in which the LSB is the first output signal OUT1 and the MSB is the sixth output signal OUT6. In such a six-bit non-synchronous counter 700, the delay time is the same as the combination of the delay times in the three selecting means 722, 742 and 772, and thus counting is faster than in conventional non-synchronous counters.

The non-synchronous counter 700 of FIG. 7 may be an N+M+K-bit non-synchronous counter when N output signal generators operate in response to the clock signal CK, M output signal generators operate in response to an Nth output signal, and K output signal generators operate in response to an N+M-th output signal.

The non-synchronous counter of FIG. 7 may include a plurality of state generators 750, that is, a plurality of state generators which operate in response to an N+M+K-th output signal may be further included therein. Also, in each state generator, a plurality of output signal generators may be included. Accordingly, it is possible to easily fabricate a synchronous or non-synchronous counter of a desired number of bits.

In the non-synchronous counter 700 of FIG. 7, flip flops 711, 721, 731, 741, 761 and 771, which are presented in the first through sixth output signal generators 710, 720, 730, 740, 760 and 770, are set or reset in response to a set or reset signal RN.

Hereinafter, a synchronous counter according to a third embodiment of the present invention will be described. The synchronous counter includes: a first output signal generator which responds to a clock signal, receives an inversion signal of a predetermined output signal and outputs the inversion signal as a first output signal; and second through N-th output signal generators which respond to the clock signal and an output signal generated by the preceding output signal generator and output predetermined second through Nth output signals (where N is a natural number greater than 1).

The first output signal generator includes a first flip flop which responds to the clock signal, outputs the inversion signal of the first output signal to an input terminal, and outputs the inversion signal as the first output signal.

Each of the second through Nth output signal generators includes $2^{N-2}$ flip flops connected together in the respective output signal generator, and a selecting means which responds to an output signal generated by the preceding output signal generator, selects either the output signal of the last flip flop among the $2^{N-2}$ flip flops or an inversion signal of the output signal, and outputs the selected signal to an input terminal of the first flip flop. The flip flops, which are connected in series, operate in response to the clock signal. The output of the last flip flop in each of the second through N-th output signal generators is generated as the respective one of the second through N-th output signals. Here, the selecting means may be a multiplexer.

Hereinafter, the synchronous counter according to a third embodiment of the present invention will be described with reference to the synchronous counter 500 of FIG. 5, which in this description is a four-bit counter with N set to 4.

A synchronous counter 500 according to the third embodiment includes a first output signal generator 510 that responds to a clock signal CK, receives an inversion signal BOUT1 of a predetermined first output signal, and outputs the inversion signal BOUT1 as the first output signal OUT1. The first output signal generator 510 includes a first flip flop 511 that responds to the clock signal CK, receives the inversion signal BOUT1 of the first output signal OUT1 through an input terminal D, and outputs the inversion signal as the first output signal OUT1. Here, the first flip flop 511 may be a toggle flip flop.

Second through fourth output signal generators 520, 530 and 540 respond to the clock signal CK and output signals OUT1 through OUT3 and output predetermined second through fourth output signals OUT2 through OUT4. The first through fourth output signals OUT1 through OUT4 are logic values of the four-bit counter 500 having the first output signal OUT1 as the LSB and the fourth output signal as the MSB. Also, the second through fourth output signal generators 520, 530 and 540 include $2^{N-2}$ flip flops connected in series in the respective output signal generator (where N is a natural number greater than 2). In detail, the second through fourth output signal generators 520, 530 and 540 respectively include a flip flop 521, two flip flops 531 and 532 connected in series, and flip flops 541 through 544 connected in series. In the second through fourth output signal generators 520 through 540, the last flip flops output the second through fourth output signals OUT2 through OUT3.

Further, the second output signal generator 520 includes a selecting means 522 that selects either an output signal OUT2 of the flip fop 521 or an inversion signal BOUT2 of the output signal OUT2, in response to the first output signal OUT1, and outputs the selected signal to an input terminal D of the flip flop 521. Here, the selecting means 522 may be a multiplexer.

The third output signal generator 530 includes a selecting means 533 that selects either an output signal OUT3 of the flip fop 532 or an inversion signal BOUT3 of the output signal OUT3, in response to the second output signal OUT2, and outputs the selected signal to an input terminal D of the flip flop 531.

The fourth output signal generator 540 includes a selecting means 545 that selects either an output signal OUT4 of the flip fop 544 or an inversion signal BOUT4 of the output signal OUT4, in response to the third output signal OUT3, and outputs the selected signal to an input terminal D of the flip flop 541.

Each of the flip flops connected in series in the synchronous counter 500 operates in response to the clock signal CK and is set or reset in response to a set or reset signal RN.

In the above-described synchronous counter 500 according to the third embodiment, delay time is less for the same reason as for the synchronous counter 500 according to the first embodiment.

Hereinafter, a non-synchronous counter according to a fourth embodiment of the present invention will be described. The non-synchronous counter according to the fourth embodiment includes a first output signal generator which responds to a clock signal, receives an inversion signal of a predetermined first output signal and outputs the inversion signal as the first output signal, an N-th output signal generator which responds to the clock signal and an N−1th output signal and outputs a predetermined Nth output signal (where N is a natural number greater than 2), an N+1th output signal generator which responds to the N-th output signal, receives a predetermined inversion signal of an N+1th output signal, and outputs the inversion signal as the N+1th output signal, and an N+M-th output signal generator which responds to the N-th output signal and an N+M−1th output signal, and outputs a predetermined N+M-th output signal (where M is a natural number greater than 2). The first through N+M-th output signals are logic values of an N+M-bit counter having the first output signal as the LSB and the N+M-th output signal as the MSB.

Further, the non-synchronous counter according to the fourth embodiment has a plurality of state generators, including an N+M+1th output signal generator which responds to the N+M-th output signal, receives an inversion signal of a predetermined N+M+1th output signal, and outputs the inversion signal as the N+M+1th output signal; and an N+M+K-th output signal generator which responds to the N+M-th output signal and the N+M+K−1th output signal and outputs a predetermined N+M+K-th output signal (where K is a natural number greater than 2). Each state generator receives the final output signal of the preceding state generator as a clock.

The first output signal generator of the non-synchronous counter according to the fourth embodiment includes a first flip flop that responds to the clock signal CK, receives an inversion signal of the first output signal through an input terminal, and outputs the inversion signal as the first output signal. The N+1th output signal generator includes an N+1th flip flop that responds to the N-th output signal, receives an inversion signal of the N+1th output signal through an input terminal, and outputs the inversion signal as the N+1th output signal. Also, the N+M+1th output signal generator includes an N+M+1th flip flop that responds to the N+M-th output signal, receives an inversion signal of the N+M−1th output signal through an input terminal, and outputs the inversion signal as the N+M+1th output signal.

Also, each of the second through Nth output signal generators, the N+2th through N+M-th output signal generators, and the N+M+2th through N+M+K-th output signal generators includes $2^{N(N+M \text{ or } N+M+K)-2}$ flip flops connected in the respective output signal generator; and a selecting means that responds to an output signal generated by the preceding output signal generator, selects either an output signal of the last output signal generator or an inversion signal of the output signal, and outputs the selected output signal as an input signal to the first flip flop.

Here, the flip flops which are connected in series in each of the second through N-th output signal generators operate in response to the clock signal, and the output of the last flip flop is generated as the respective one of the second through N-th output signals. The flip flops which are connected in series in each of the N+2th through N+M-th output signal generators operate in response to the N-th output signal, and the output of the last flip flop is generated as the respective one of the N+2th through N+M-th output signals. The flip flops which are connected in series in each of the N+M+2th through N+M+K-th output signal generators operate in response to the N+M-th output signal, and the output of the last flip flop is generated as the respective one of the N+2th through N+M+K-th output signals.

Hereinafter, a non-synchronous counter according to the fourth embodiment of the present invention will now be described with reference to the synchronous counter 700 of FIG. 7, assuming that N, M and K are 2.

The non-synchronous counter 700 according to the fourth embodiment includes a first output signal generator 710 that responds to a clock signal CK, receives an inversion signal BOUT1 of a predetermined first output signal and outputs it as a first output signal OUT1. The first output signal generator 710 includes a first flip flop 711 that responds to the clock signal CK, receives the inversion signal BOUT of the first output signal through an input terminal D, and outputs it as the first output signal OUT1. Here, the first flip flop 711 may be a toggle flip flop.

The second output signal generator 720 responds to the clock signal CK and the first output signal OUT1, and generates a second output signal OUT2. To achieve this, the second output signal generator 720 includes $2^{N-2}$ flip flops connected in series. In detail, the second output signal generator 720 includes a flip flop 721. Also, the second output signal generator 720 includes a selecting means 722 that responds to the first output signal OUT1, selects either the second output signal OUT2 of the flip flop 721 or an inversion signal BOUT2 of the second output signal OUT2, and outputs the selected signal to an input terminal D of the flip flop 721. Here, the selecting means 722 may be a multiplexer, and the number of first and second output signal generators 710 and 720 may be increased to N (where N is a natural number greater than 1).

Third and fourth output signal generators 730 and 740 have equivalent circuits to the first and second output signal generators 710 and 720, but differ in that flip flops 731 and 741 operate in response to the second output signal OUT2 rather than the clock signal CK. The number of third and fourth output signal generators 730 and 740 can be increased to M (where M is a natural number greater than 1).

The non-synchronous counter 700 according to the fourth embodiment is a four-bit non-synchronous counter that has the LSB as the first output signal OUT1 and the MSB as the fourth output signal OUT4. Also, the non-synchronous counter 700 according to the fourth embodiment may be an N+M-bit non-synchronous counter when N output signal generators operate in response to the clock signal CK, and M output signal generators operate in response to an N-th output signal.

In such a four-bit non-synchronous counter 700, the delay time is the same as the combination of the delay times of the selecting means 722 and 742, and therefore counting is faster than in conventional non-synchronous counters.

It is preferable that the non-synchronous counter 700 of FIG. 7 further include a plurality of state generators 750.

Each state generator 750 includes: a fifth output signal generator 760 that responds to the fourth output signal OUT4 and outputs a fifth output signal OUT5 in which a low level and a high level are output once per cycle of the fourth output signal OUT4, and a sixth output signal generator 770 that responds to the fourth and fifth output signals OUT4 and OUT5 and outputs a sixth output signal OUT6 in which a low level and a high level are output every two cycles of the fourth output signal OUT4.

The fifth and sixth output signal generators 760 and 770, which are included in the state generator 750, have equivalent circuits to the first and second output signal generators 710 and 720, but differ in that flip flops 761 and 771 respond to the fourth output signal OUT4 rather than the clock signal CK. Here, the number of fifth and sixth output signal generators 760 and 770 can be increased to K (where K is a natural number greater than 1).

The operation of the non-synchronous counter 700 according to the fourth embodiment is the same as that of the non-synchronous counter 700 according to the second embodiment, and thus a repeat description will be omitted.

The non-synchronous counter 700 according to the fourth embodiment is a six-bit non-synchronous counter having the LSB as the first output signal OUT1 and the MSB as the sixth output signal OUT6. In this non-synchronous counter 700, the delay time is the same as the combination of the delay times of the selecting means 722, 742 and 772, and therefore, counting is faster than in conventional non-synchronous counters.

Also, the non-synchronous counter 700 of FIG. 7 may be an N+M+K-bit non-synchronous counter when N output signal generators operate in response to the clock signal CK, M output signal generators operate in response to an N-th output signal, and K output signal generators operate in response to an N+M-th output signal.

The non-synchronous counter 700 may further include a plurality of state generators 750 that operate in response to an N+M+K-th output signal. Further, a plurality of output signal generators can be included in each state generator. Accordingly, a synchronous or non-synchronous counter can be made in accordance with the invention having a desired number of bits.

As described above, a synchronous or non-synchronous counter according to the present invention has a reduced delay time, thereby ensuring a spacious margin in the peripheral circuits of the counter during design.

While this invention has been particularly shown and described with reference to preferred embodiments thereof, it will be understood by those skilled in the art that various changes in form and details may be made therein without departing from the spirit and scope thereof as defined by the appended claims.

What is claimed is:

1. A counter comprising:
   a first output signal generator for outputting a first output signal in which a low level and a high level are output once per cycle of a clock signal, in response to the clock signal;
   an N-th output signal generator for outputting an N-th output signal in which a low level and a high level are output every $2^{N-1}$ cycles of the clock signal, in response to the clock signal and an N−1th output signal, the N-th output signal generator including a clock input at which only the clock signal is applied, where N is a natural number greater than 1;
   an N+1th output signal generator for outputting an N+1th output signal in which a low level and a high level are output once per cycle of the N-th output signal, in response to the N-th output signal, the N-th output signal being directly connected to a clock input of the N+1th output signal generator;
   an N+M-th output signal generator for outputting an N+M-th output signal in which a low level and a high level are output every $2^{M-1}$ cycles of the N-th output signal, in response to the N-th output signal and an N+M−1th output signal, wherein the first through N+M-th output signals represent logic values of an N+M-bit counter having the first output signal as the least significant bit (LSB) and the N+M-th output signal as the most significant bit (MSB); and
   a plurality of state generators including an N+M+1th output signal generator for outputting an N+M+1th output signal in which a low level and a high level are output once per cycle of the N+M-th output signal, in response to the N+M-th output signal and an N+M+K-th output signal generator for outputting an N+M+K-th output signal in which a low level and a high level are output every $2^{K-1}$ cycles of the N+M-th output signal, in response to the N+M-th and N+M+K−1th output signals, where K is a natural number greater than 1, wherein each state generator receives a final output signal generated by a preceding state generator as a clock.

2. The counter of claim 1, wherein the counter is a non-synchronous counter.

3. A counter comprising:
   a first output signal generator for responding to a clock signal and receiving an inversion signal of a first output signal;
   an N-th output signal generator for responding to the clock signal and the N−1th output signal and outputting a N-th output signal, the N-th output signal generator including a clock input at which only the clock signal is applied;
   an N+1th output signal generator for responding to the N-th output signal and receiving an inversion signal of a predetermined N+1th output signal, the N-th output signal being connected to a clock input of the N+1th output signal generator; and
   an N+M-th output signal generator for responding to an N+M−1th output signal and outputting a N+M-th output signal, wherein the first through N+M-th output signals represent logic values of an N+M-bit counter in which the first output signal is the LSB and the N+M-th output signal is the MSB; wherein the counter further comprises:
   a plurality of state generators including an N+M+1th output signal generator for responding to the N+M-th output signal and receiving an inversion signal of a N+M+1th output signal and an N+M+K-th output signal generator which responds to the N+M-th output signal and the N+M+K−1th output signal and outputs a N+M+K-th output signal, wherein each state generator receives a final output signal of a preceding state generator as a clock.

4. The counter of claim 3, wherein the counter is a non-synchronous counter.

* * * * *

UNITED STATES PATENT AND TRADEMARK OFFICE
CERTIFICATE OF CORRECTION

PATENT NO. : 7,123,679 B2 Page 1 of 1
APPLICATION NO. : 10/269253
DATED : October 17, 2006
INVENTOR(S) : Ki-mo Joo It is certified that error appears in the above-identified patent and that said Letters Patent is hereby corrected as shown below:

In Column 14, line 22 insert --repeated-- after "are".

Signed and Sealed this

Sixth Day of March, 2007

JON W. DUDAS
*Director of the United States Patent and Trademark Office*